US011823867B2

(12) United States Patent
Geissler

(10) Patent No.: US 11,823,867 B2
(45) Date of Patent: Nov. 21, 2023

(54) LOAD CURRENT DERIVED SWITCH TIMING OF SWITCHING RESONANT TOPOLOGY

(71) Applicant: Kaufman & Robinson, Inc., Fort Collins, CO (US)

(72) Inventor: Steven J. Geissler, Wellington, CO (US)

(73) Assignee: Kaufman & Robinson, Inc., Fort Collins, CO (US)

( * ) Notice: Subject to any disclaimer, the term of this patent is extended or adjusted under 35 U.S.C. 154(b) by 155 days.

(21) Appl. No.: 17/558,527

(22) Filed: Dec. 21, 2021

(65) Prior Publication Data

US 2022/0375720 A1 Nov. 24, 2022

Related U.S. Application Data

(60) Provisional application No. 63/191,158, filed on May 20, 2021.

(51) Int. Cl.
*H01J 37/32* (2006.01)
*H05H 1/46* (2006.01)

(52) U.S. Cl.
CPC ..... *H01J 37/32174* (2013.01); *H05H 1/4645* (2021.05)

(58) Field of Classification Search
None
See application file for complete search history.

(56) References Cited

U.S. PATENT DOCUMENTS

| 3,198,884 | A | * | 8/1965 | Dersch | G10L 15/02 704/251 |
| 3,860,507 | A | * | 1/1975 | Vossen, Jr. | H01J 37/34 204/192.15 |
| 4,043,889 | A | * | 8/1977 | Kochel | H01J 37/3402 204/298.03 |
| 4,557,819 | A | * | 12/1985 | Meacham | H01J 37/32082 156/345.46 |
| 5,559,757 | A | * | 9/1996 | Catipovic | H04B 11/00 367/134 |
| 7,321,259 | B1 | * | 1/2008 | Shumarayev | H03F 3/45183 330/253 |
| 7,724,079 | B1 | * | 5/2010 | Shumarayev | H03F 3/45973 327/317 |
| 8,053,991 | B2 | * | 11/2011 | Kim | H03H 7/40 315/111.21 |
| 8,267,041 | B2 | * | 9/2012 | Abe | H01J 37/32091 156/345.46 |
| 8,466,623 | B2 | * | 6/2013 | Kim | H03H 7/40 315/111.21 |
| 8,542,471 | B2 | * | 9/2013 | Bulliard | H01J 37/3444 361/79 |
| 8,837,100 | B2 | * | 9/2014 | Bulliard | H01J 37/3444 361/79 |
| 8,854,781 | B2 | * | 10/2014 | Bulliard | H02H 1/06 361/79 |
| 9,214,801 | B2 | * | 12/2015 | Bulliard | H01J 37/3444 |
| 9,997,903 | B2 | * | 6/2018 | Bulliard | H01J 37/3444 |
| 10,264,663 | B1 | * | 4/2019 | Long | H05H 1/46 |

(Continued)

*Primary Examiner* — Srinivas Sathiraju
(74) *Attorney, Agent, or Firm* — Osha Bergman Watanabe & Burton LLP

(57) ABSTRACT

Systems, devices, and methods are discussed relating to plasma sources using load current switch timing of zero volt switching resonant topology.

20 Claims, 5 Drawing Sheets

(56) References Cited

U.S. PATENT DOCUMENTS

| | | | |
|---|---|---|---|
| 11,150,283 B2* | 10/2021 | Ulrich | G01R 25/02 |
| 11,335,540 B2* | 5/2022 | Bhutta | C23C 16/52 |
| 2002/0153242 A1* | 10/2002 | Signer | H01J 37/32431 |
| | | | 204/192.12 |
| 2004/0107906 A1* | 6/2004 | Collins | H01J 37/321 |
| 2004/0107908 A1* | 6/2004 | Collins | H01J 37/32082 |
| 2004/0112542 A1* | 6/2004 | Collins | H01J 37/32082 |
| | | | 156/345.48 |
| 2020/0150164 A1* | 5/2020 | Ulrich | G01R 25/04 |
| 2020/0168439 A1* | 5/2020 | Bhutta | H03H 7/38 |
| 2022/0246401 A1* | 8/2022 | Ulrich | C23C 16/52 |
| 2022/0375720 A1* | 11/2022 | Geissler | H05H 1/4645 |
| 2023/0207267 A1* | 6/2023 | Valcore, Jr. | H01J 37/32183 |
| | | | 315/111.21 |

* cited by examiner

LOAD CURRENT DERIVED SWITCH TIMING OF SWITCHING RESONANT TOPOLOGY

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever. Copyright © 2021, Fortinet, Inc.

FIELD

Embodiments discussed generally relate to plasma sources, and more particularly to a plasma source using load current switch timing of zero volt switching resonant topology.

BACKGROUND

Generally, plasma sources are driven by RE power supplies connected remotely through 50 Ohm coaxial cables. In these systems the plasma load impedance must be converted to 50 Ohms using an RF matching network. In some cases driving a plasma load is done by a switching power source connected directly to the plasma source through a series matching capacitor. The series matching capacitor cancels the inductive component of the plasma source when driven at the resonant frequency. To achieve this goal, the power source is switched based upon a signal generator circuit that seeks to match a resonant frequency of the plasma load. The signal generator circuit creates a synthetic frequency at which the power source is switched. In particular, the generator circuit uses a controller that receives the resonant frequency of the plasma load. Where the controller determines that the resonant frequency of the plasma load is different from the created synthetic frequency the controller modifies a frequency control that governs the synthetic frequency much like a phase lock loop. Such an approach may operate in theory, however, a high Q circuit makes it highly unstable in environments where the resonant frequency of the plasma load is varying by even small amounts. For example, it may take tens of microseconds to retune the synthetic frequency each time a minor variance in the resonant frequency of the plasma load is detected. Such retuning may be a recurring requirement that can greatly reduce the efficiency of the combination of the switching power source and the plasma load, or even damage switching power source. In addition to the unstable plasma control, the switching devices must be switched just before the resonant current reaches zero to achieve low loss zero voltage switching.

Thus, there exists a need in the art for more advanced approaches, devices and systems for providing switched power to a plasma source.

SUMMARY

Various embodiments discussed generally relate to plasma sources, and more particularly to a plasma source using load current switch timing of zero volt switching resonant topology.

This summary provides only a general outline of some embodiments. Many other objects, features, advantages and other embodiments will become more fully apparent from the following detailed description, the appended claims and the accompanying drawings and figures.

BRIEF DESCRIPTION OF THE DRAWINGS

A further understanding of the various embodiments may be realized by reference to the figures which are described in remaining portions of the specification. In the figures, similar reference numerals are used throughout several drawings to refer to similar components. In some instances, a sub-label consisting of a lower-case letter is associated with a reference numeral to denote one of multiple similar components. When reference is made to a reference numeral without specification to an existing sub-label, it is intended to refer to all such multiple similar components.

DETAILED DESCRIPTION

Figure 1:
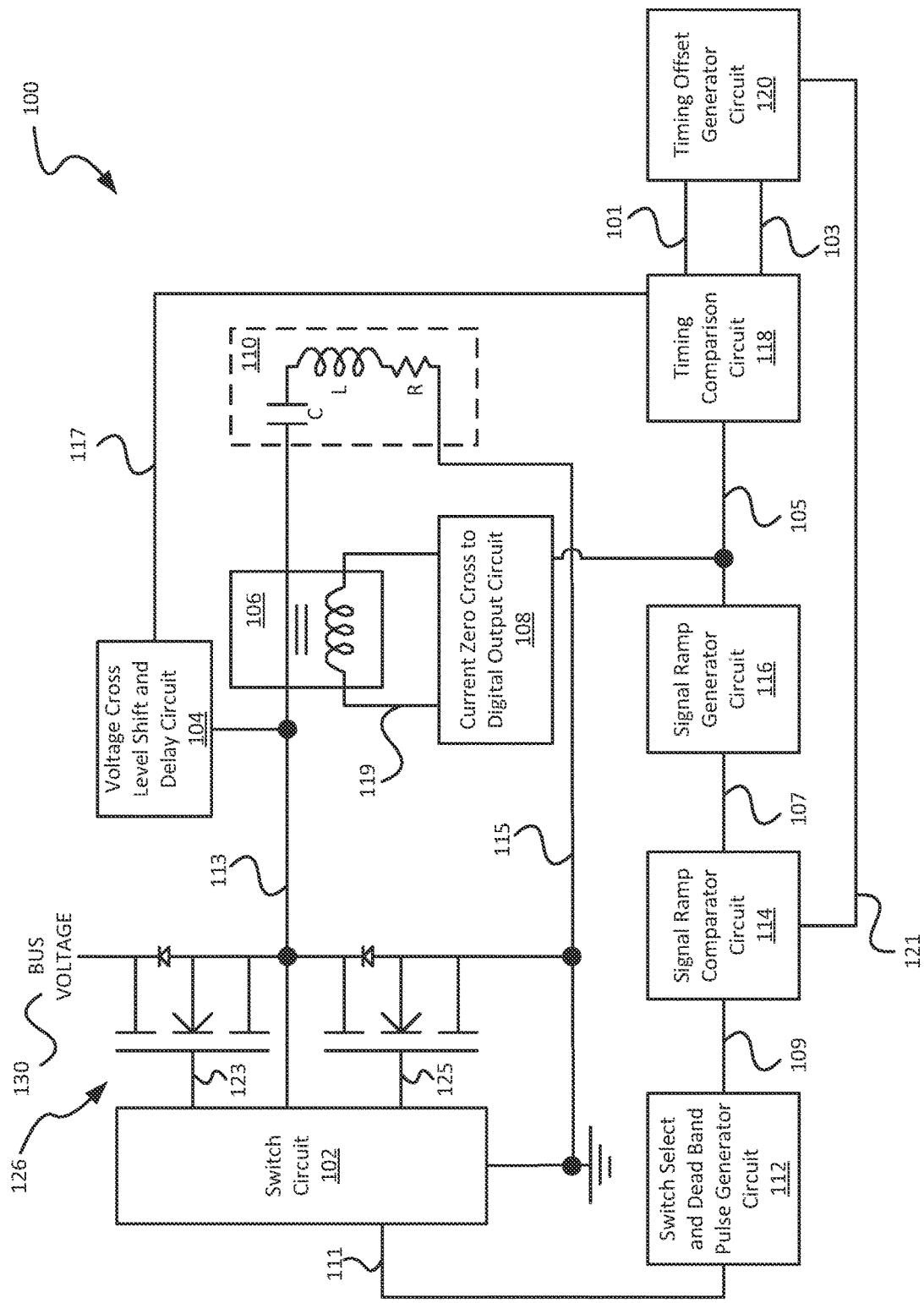
FIG. 1 is a block diagram of a power s g circuit configured to drive a resonant load in accordance with some embodiments.

Various embodiments discussed generally relate to plasma sources, and more particularly to a plasma source using load current switch timing of zero volt switching resonant topology.

Some embodiments provide systems, methods, and/or circuits for controlling switching power for a resonant load. The resonant frequency of the resonant load defines the frequency of the switching power eliminating e need for a synthesized frequency generation circuit. As such, the embodiments provide a response to changes in the resonant frequency of the resonant load that is faster than that expected in circuit relying on synthesized frequencies. A timing correction circuit operates to align the transition edges of the switching power devices to the current zero crossings of the resonant load.

In some cases, such direct use of the resonant frequency of the resonant load rather than a synthesized frequency allows stability of zero volt switching over wide frequency changes in the resonant load. Further, the need for a relatively expensive voltage controlled oscillator used to synthesize frequencies is eliminated, Based upon the disclosure provided herein, one of ordinary skill in the art will recognize a variety of advantages that may be achieved in relation to different embodiments.

Various methods described herein may be practiced by connecting one or more hardware circuits together, and/or a combination of one or more hardware circuits and one or more machine-readable storage media containing the code according to the present disclosure with appropriate standard computer hardware to execute the code contained therein. An apparatus for practicing various embodiments of the present disclosure may involve one or more processing resources in concert with one or more dedicated hardware circuits and storage systems containing or having network access to computer program(s) coded in accordance with various methods described herein, and the method steps of the disclosure could be accomplished by modules, routines, subroutines, or subparts of a computer program product.

In the following description, numerous specific details are set forth in order to provide a thorough understanding of embodiments of the present disclosure. It will be apparent to one skilled in the art that embodiments of the present disclosure may be practiced without some of these specific details.

Terminology

Brief definitions of terms used throughout this application are given below.

The terms "connected" or "coupled" and related terms, unless clearly stated to the contrary, are used in an operational sense and are not necessarily limited to a direct connection or coupling. Thus, for example, two devices may be coupled directly, or via one or more intermediary circuits or devices. As another example, devices may be coupled in such a way that information can be passed there between, while not sharing any physical connection with one another. Based on the disclosure provided herein, one of ordinary skill in the art will appreciate a variety of ways in which connection or coupling exists in accordance with the aforementioned definition.

If the specification states a component or feature "may", "can", "could", or "might" be included or have a characteristic, that particular component or feature is not required to be included or have the characteristic.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The phrases "in an embodiment," "according to one embodiment," and the like generally mean the particular feature, structure, or characteristic following the phrase is included in at least one embodiment of the present disclosure, and may be included in more than one embodiment of the present disclosure. Importantly, such phrases do not necessarily refer to the same embodiment.

The phrase "processing resource" is used in its broadest sense to mean one or more processors capable of executing instructions. Based upon the disclosure provided herein, one of ordinary skill in the art will recognize a variety of processing resources that may be used in relation to a particular embodiments.

Example embodiments will now be described more fully hereinafter with reference to the accompanying drawings, in which exemplary embodiments are shown. This disclosure may, however, be embodied in many different forms and should not be construed as limited to the embodiments set forth herein. It will be appreciated by those of ordinary skill in the art that the diagrams, schematics, illustrations, and the like represent conceptual views or processes illustrating systems and methods embodying various aspects of the present disclosure. The functions of the various elements shown in the figures may be provided through the use of dedicated hardware as well as hardware capable of executing associated software and their functions may be carried out through the operation of program logic, through dedicated logic, through the interaction of program control and dedicated logic.

Various embodiments provide processing systems that include a load and a power switching circuit. The power switching circuit is configured to provide a power signal to the load, where the power signal transitions through a level based in part upon operation of the load. The power switching circuit includes: a transition detection circuit configured to detect the transitions of the power signal through the level and to provide a corresponding transition output; a timing detection circuit configured to detect a time offset between an edge of the transition output and an edge of the power signal and provide a corresponding timing correction output; a signal generation circuit configured to generate a switch input based at least in part on a combination of the timing correction output and the transition output; and a switching drive circuit configured to change polarity of the power signal based at least in part on the switch input.

In some instances of the aforementioned embodiments, a frequency of the load varies by more than ten percent. In various instances of the aforementioned embodiments, the transition detection circuit includes a transformer configured to transform the power signal to a transformed power signal. In some such instances, the transition detection circuit further includes a level crossing detection circuit configured to detect a crossing of the transformed power signal through the level. The transition output is a timing signal indicating each occurrence of the crossing of the power signal through the level. In some cases, a first time period between assertion of a first instance of the transition output and a second instance of the transition output can vary by more than five percent when compared to a second time period between assertion of the second instance of the transition output and a third instance of the transition output, where the second instance of the transition output directly follows the first instance of the transition output and the third instance of the transition output directly follows the second instance of the transition output. In various cases, the level is a zero level, and the level crossing detection circuit is a diode rectifier circuit configured to detect zero voltage crossings.

In various instances of the aforementioned embodiments, the timing correction output is a voltage level, and the signal generation circuit includes: a signal ramp generator circuit configured to generate a ramp signal that ramps from a defined level at a constant rate upon assertion of the transition output; a signal ramp comparator circuit configured to assert a switch timing output each time the ramp signal is at least the voltage of voltage level of the timing correction output; and a pulse circuit configured to assert the switch input based at least in part on assertion of the switch timing output. In some instances of the aforementioned embodiments, the switching drive circuit includes: a switch circuit configured to switch between a first driver output and a second driver output based upon the switch input; and a half bridge inverter circuit controlling the power signal based upon the first driver output and the second driver output. In some instances of the aforementioned embodiments, the timing detection circuit includes: a voltage comparator circuit configured to assert a power signal timing output each time a voltage of the power signal crosses zero volts; and an edge comparator circuit configured to assert the timing correction output at a voltage level corresponding to a difference in an edge of the power signal and the edge of the transition output. In some cases, the voltage level is: decreased when the edge of the transition output leads the edge of the power signal, and increased when the edge of the transition output lags the edge of the power signal.

Other embodiments provide methods for providing power to a resonant load. The methods include: applying an initial impulse input to the resonant load to cause the resonant load to resonate; providing a power signal to the resonant load, wherein the power signal transitions through a level based in part upon operation of the resonant load; detecting transitions in the power signal through the level; generating a transition output corresponding to the detected transitions through the level; detecting a timing offset between an edge the transition output and an edge of the power signal; generating a timing correction output corresponding to the timing offset; and generating a switch input based at least in part on a combination of the timing correction output and the transition output.

Turning to FIG. 1, a block diagram of a power switching circuit 100 is shown in accordance with some embodiments that drives a resonant load 110. Resonant load 110 is represented as a series of resistance (R), capacitance (C), and inductance (L) that when operating generally resonate at a predicted resonant frequency. However, changes in the operation parameters can cause some variance in the resonant frequency. In some embodiments, resonant load 110 is a plasma chamber used in semiconductor processing and for other purposes. Such a plasma chamber may include, but is not limited to, a chemical vapor deposition chamber, an atomic layer deposition chamber, a capacitive coupled plasma chamber, a plasma etch chamber, a plasma deposition chamber, a plasma enhanced atomic layer deposition chamber, a transformer coupled plasma reactor, or a plasma enhanced chemical vapor deposition chamber as are known in the art. Based upon the disclosed herein, one of ordinary skill in the art will recognize a variety of loads that may be used in place of resonant load 110.

Resonant load 110 is powered by a half bridge inverter circuit 126 that is switched based upon switching signals 123, 125 under control of a switch circuit 102. The switching of switching signals 123, 125 results in switching on a power output 113. Any power switching circuit known in the art may be used in place of half bridge inverter circuit 126. A current transformer 106 is connected to resonant load 110. Current transformer 106 provides a representation of current being transferred to resonant load 110 via an electrical conductor carrying a power output 113. The current being transferred to resonant load 110 exhibits the frequency at which the resonant load is operating, and this same frequency is reflected in a transformer output 119 that is provided to a current zero cross to digital output circuit 108.

Figure 4:
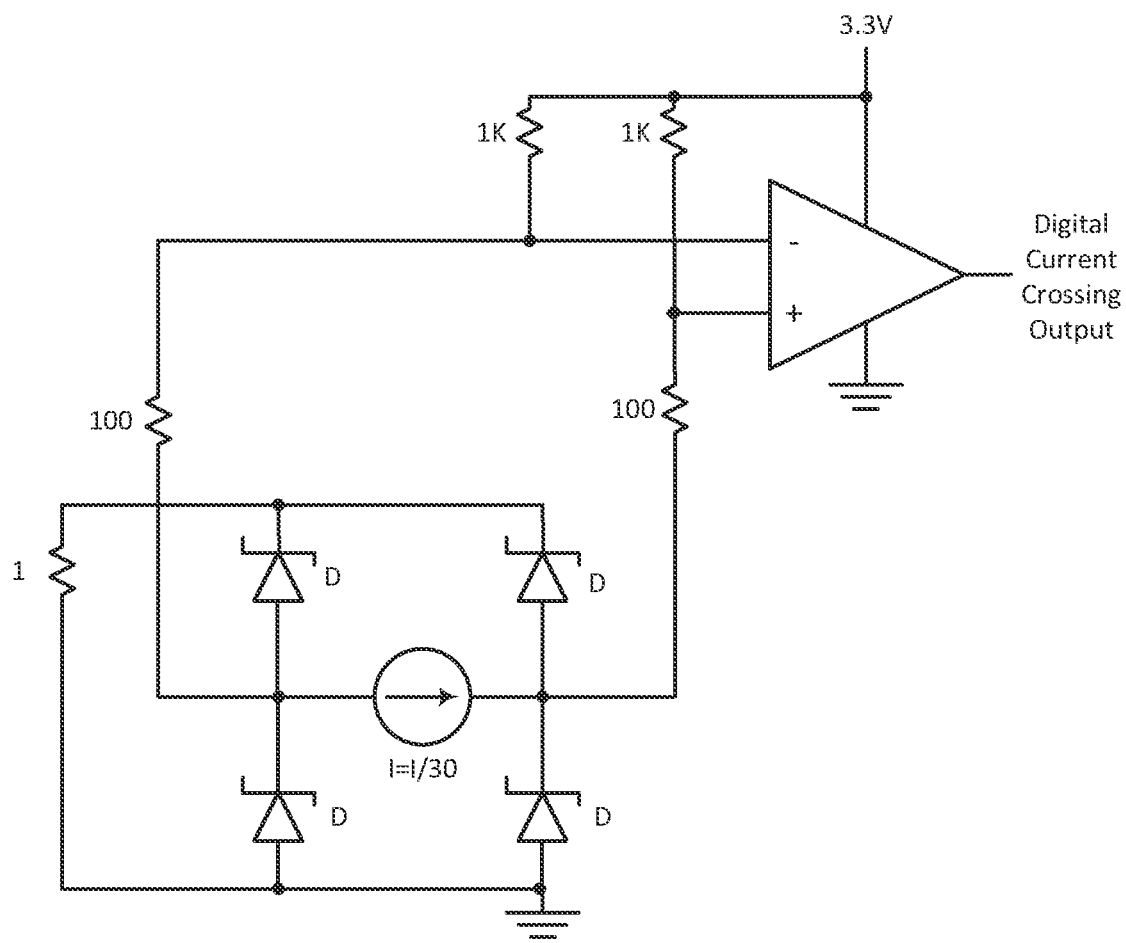
FIG. 4 shows a diode rectifier circuit that be used in relation to one or more embodiments.

Current zero cross to digital output circuit 108 includes a digital circuit that transforms transformer output 119 to a digital zero crossing output 105. Digital zero crossing output 105 switches between two voltage levels compatible with other downstream digital circuitry. As an example, digital zero crossing output 105 switches between 0 Volts and 3.3 Volts. In some embodiments, current zero cross to digital output circuit 108 is a diode rectifier circuit similar to that shown in FIG. 4 below. Based upon the disclosure provided herein, one of ordinary skill in the art will recognize a variety of circuitry that can be used to convert transformer output 119 to a corresponding digital signal exhibiting the same frequency. Further, based upon the disclosure provided herein, one of ordinary skill in the art will recognize a variety of voltage levels between which digital zero crossing output 105 can be switched in accordance with different embodiments.

A voltage cross level shift and delay circuit 104 is connected to power output 113, and is a voltage sensing circuit configured to sense each time the voltage of power signal 113 crosses ½ bus volts. Each time the voltage of power output 113 crosses ½ bus volts, voltage cross level shift and delay circuit 104 asserts a zero crossing output 117. Zero crossing output 117 is a digital output that switches between two voltage levels compatible with other downstream digital circuitry. As an example, zero crossing output 117 switches between 0 Volts and 3.3 Volts. In some embodiments, voltage cross level shift and delay circuit 104 is a comparator circuit with an output that switches at a desire digital voltage. Based upon the disclosure provided herein, one of ordinary skill in the art will recognize a variety of circuitry that can be used to detect zero voltage crossings and assert a digital output indicating the occurrence of a zero voltage crossing.

Assertion of zero crossing output 117 corresponds to an edge of power output 113 and is provided to a timing comparison circuit 118. Timing comparison circuit 118 compares voltage zero crossing output 117 with current zero crossing output 105 to yield a phase lead output 101 and a phase lag output 103. Timing comparison circuit 118 asserts lag output 103 with a duty cycle or duration corresponding to the lag of voltage zero crossing output 117 to current zero crossing output 105. As an example, in one embodiment, Timing comparison circuit 118 is implemented as an XOR circuit operable to assert whenever there is a mismatch between voltage zero crossing output 117 to current zero crossing output 105. When the mismatch is due to voltage zero crossing output 117 leading current zero crossing output 105, a lead output 101 is asserted for a period corresponding to the mismatch (i.e., the time period that voltage zero crossing output 117 leads current zero crossing output 105; and when the mismatch is due to voltage zero crossing output 117 lagging current zero crossing output 105, lag output 103 is asserted for a period corresponding to the mismatch (i.e., the time period that voltage zero crossing output 117 lags current zero crossing output 105). Based upon the disclosure provided herein, one of ordinary skill in the art will recognize a variety of circuitry that can be used to generate lead and lag signals based upon two or more inputs.

A timing reference generator circuit 120 receives lead output 101 and lag output 103. Timing reference generator circuit 120 integrates the asserted one of lead output 101 or lag output 103 and provides a delay reference signal 121 corresponding to the amount of lead/lag between digital zero crossing output 105 and zero crossing output 117. Any integration circuit known in the art that is capable of generating a delay signal may be used as timing offset generator circuit 120.

In this embodiment, delay reference signal 121 is a substantially DC voltage that is increased to delay signal 109 (move the transition of power signal 113 to a later point and reduce the lead), or decreased to reduce the delay signal 109 (move the transition of power signal 113 to an earlier point, and thereby reduce any lag). As more fully described below, this voltage level of delay reference signal 121 is used to define a timing signal 109 that modifies the timing of the power signal provided to drive resonant load 110.

Digital zero crossing output 105 is also provided to a signal ramp generator circuit 116. Signal ramp generator circuit 116 provides a ramp signal 107 that increases in voltage at a defined rate from a start point. The start point is either a rising edge of digital zero crossing output 105 (a positive going zero crossing) or a falling edge of digital zero crossing output 105 (a negative going zero crossing). Ramp signal 107 is provided to a signal ramp comparator circuit 114 that compares ramp signal 107 with delay reference signal 121, and asserts timing signal 109 when ramp signal 107 is the same are greater than delay reference signal 121. Signal ramp comparator circuit 114 may be, but is not limited to, a comparator circuit.

Said another way, lead output 101 and lag output 103 tell timing reference generator circuit 120 when the power output 113 is changing polarity with respect to the current crossing. By delaying voltage zero crossing output 117, timing reference generator circuit 120 is thinking the voltage zero crossing points of power output 113 are too late and will compensate by lowering the voltage on delay reference signal 121 such that it will cause signal ramp generator circuit 114 to assert timing signal 109 earlier in the cycle (i.e., lower on each ramp of ramp signal 107). This is how power switching circuit 100 corrects for the delays (comparators, switch select, switch drive, and transistor delays) of various circuitry. In effect, timing signal 109 is asserted early so that the actual voltage zero crossing occurs consistent with (i.e., on time) that needed by resonant load 110.

Timing signal 109 is provided to a switch select and dead band pulse generator circuit 112. Switch select and dead band pulse generator circuit 112 toggles a gate drive signal 111 and applies a constant dead band delay to gate drive signal 111. The added dead band delay is used to tune for zero volt transitions. Gate drive signal 111 is received by switch circuit 102 where it is used to drive switch signals 123, 125, which switch a bus voltage 130. Each time gate drive signal 111 is pulsed, switch circuit 102 reverses which of drive switch signals 123, 125 is asserted.

Various prior power switching circuits use straight forward RF amplifier design techniques based upon synthetic frequency generation circuits which yield process benefits. Such approaches work well in steady state scenarios, however, most resonant loads are not ideal and as such can exhibit significant variations in the resonant frequency of the resonant load. In such RF amplifier based power switching circuits a plasma chamber load will often lose plasma and require a full re-ignition of the plasma chamber, which in some cases is not possible. The embodiments discussed herein resolve such issues by using the resonant frequency of the resonant load directly as it varies, rather than attempting to synthesize a frequency representing the resonant frequency.

Figure 2:
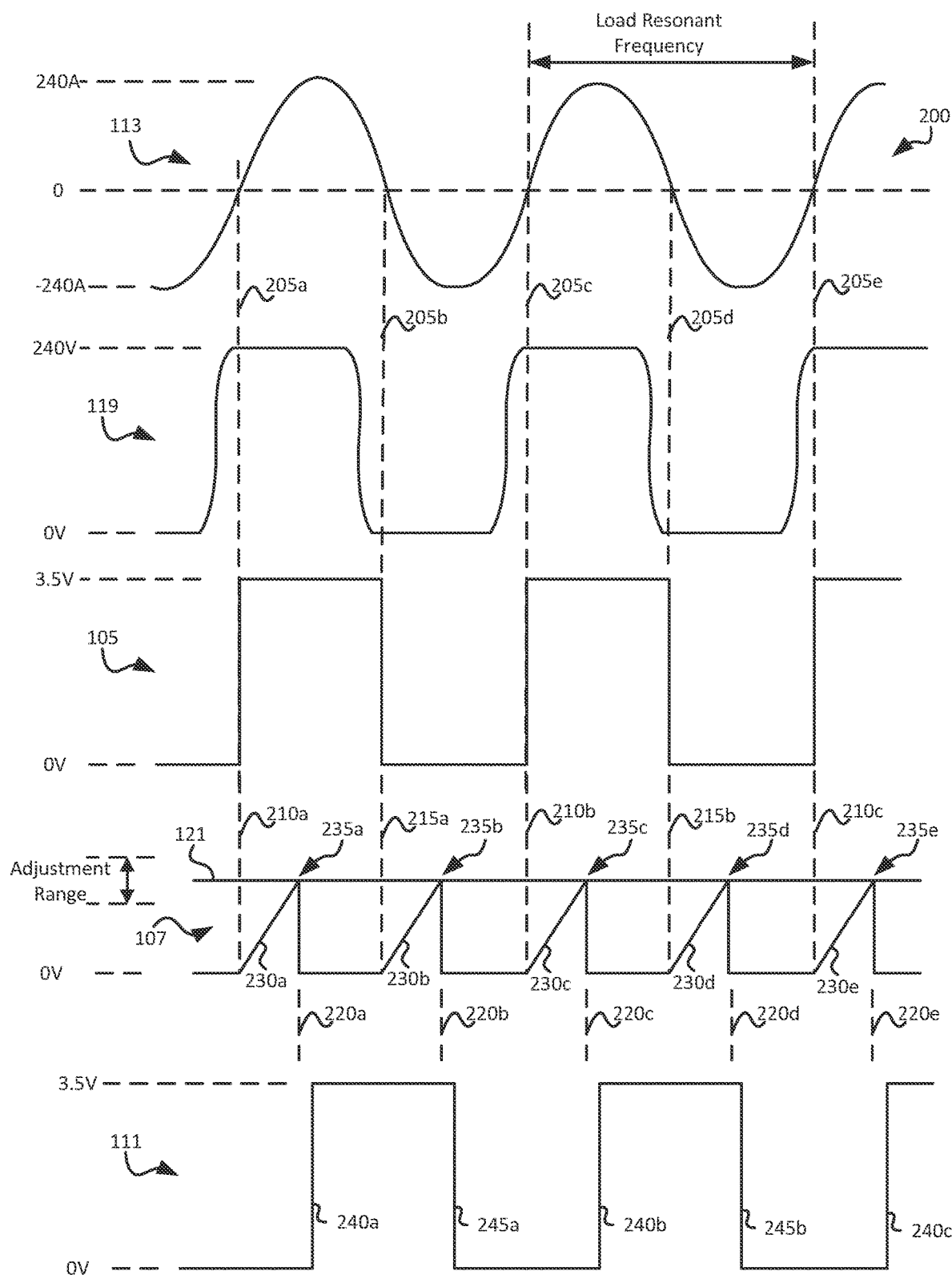
FIG. 2 shows an ideal zero volt switching timing waveform including a resonant load current of the resonant load of FIG. 1 including various other signals of FIG. 1 relative to the resonant load current.

Turning to FIG. 2, an ideal zero volt switching timing waveform 200 is shown including power signal 113 of resonant load 110 of FIG. 1 and including various other signals of FIG. 1 relative to power signal 113. As shown, power signal 113 switches a power output between extremes (in this case 240 A and 0 A). Power signal 113 switches at a frequency defined by the load (i.e., the load resonant frequency). Again, this is an ideal zero volt switching timing waveform 200 so the load resonant frequency does not change. However, in non-ideal scenarios, the load resonant frequency can vary significantly and embodiments disclosed herein do not unlock from the varying load resonant frequency and thus provide stable operation over a wide frequency range. In some embodiments, the load resonant frequency varies by more than five (5) percent. In various embodiments, the load resonant frequency varies by more than ten (10) percent. In one or more embodiments, the load resonant frequency varies by more than twenty (20) percent.

As shown, power signal 113 exhibits a number of zero crossings some examples of which are shown as dashed lines 205a, 205b, 205c, 205d, 205e. A transformer receives power signal 113 and produces a corresponding transformer output 119. Transformer output 119 is provided to a current zero cross to digital output circuit that provides a corresponding digital zero crossing output 105. Digital zero crossing output 105 switches between two voltage levels compatible with other downstream digital circuitry (in this case, digital zero crossing output 105 switches between 0 Volts and 3.3 Volts). Each rising edge of digital zero crossing output 105 corresponds to a directly preceding rising edge of transformer output 119, and each falling edge of digital zero crossing output 105 corresponds to a directly preceding falling edge of transformer output 119.

Each rising edge (indicated by dashed lines 210a, 210b, 210c) and each falling edge (indicated by dashed lines 215a, 215b) of digital zero crossing output 105 triggers the start of ramp signal 107 which increases in voltage at a defined rate. Ramp signal 107 is compared w delay reference signal 121 by a signal ramp comparator circuit. The value of delay reference signal 121 may be adjusted by an amount such that it can vary over an adjustment range by a timing reference generator circuit. This adjustment range may be artificially limited to limit the amount of timing adjustment that is applied, or may extend the entire range possible by ramp signal 107. In the depicted embodiment, ramp signal 107 is reset each time its voltage equals that of delay reference signal 121. In other embodiments, ramp signal 107 is reset coincident with each rising and falling edge of digital zero crossing output 105. In this embodiment, each time ramp signal 107 equals digital zero crossing output 105, gate drive signal 111 is toggled causing a switch in power signal 113.

As such, the timing of the zero crossings (i.e., the polarity changes) of power signal 113 is directly connected with the load resonant frequency. This is unlike other approaches where the frequency of the switching is indirectly generated using a frequency generation circuit that is prone to unlocking. This is particularly important in cases where the resonant load is a plasma chamber which will often lose plasma ignition when the frequency of the switching power drifts too far from the resonant frequency of the plasma chamber.

Figure 3:
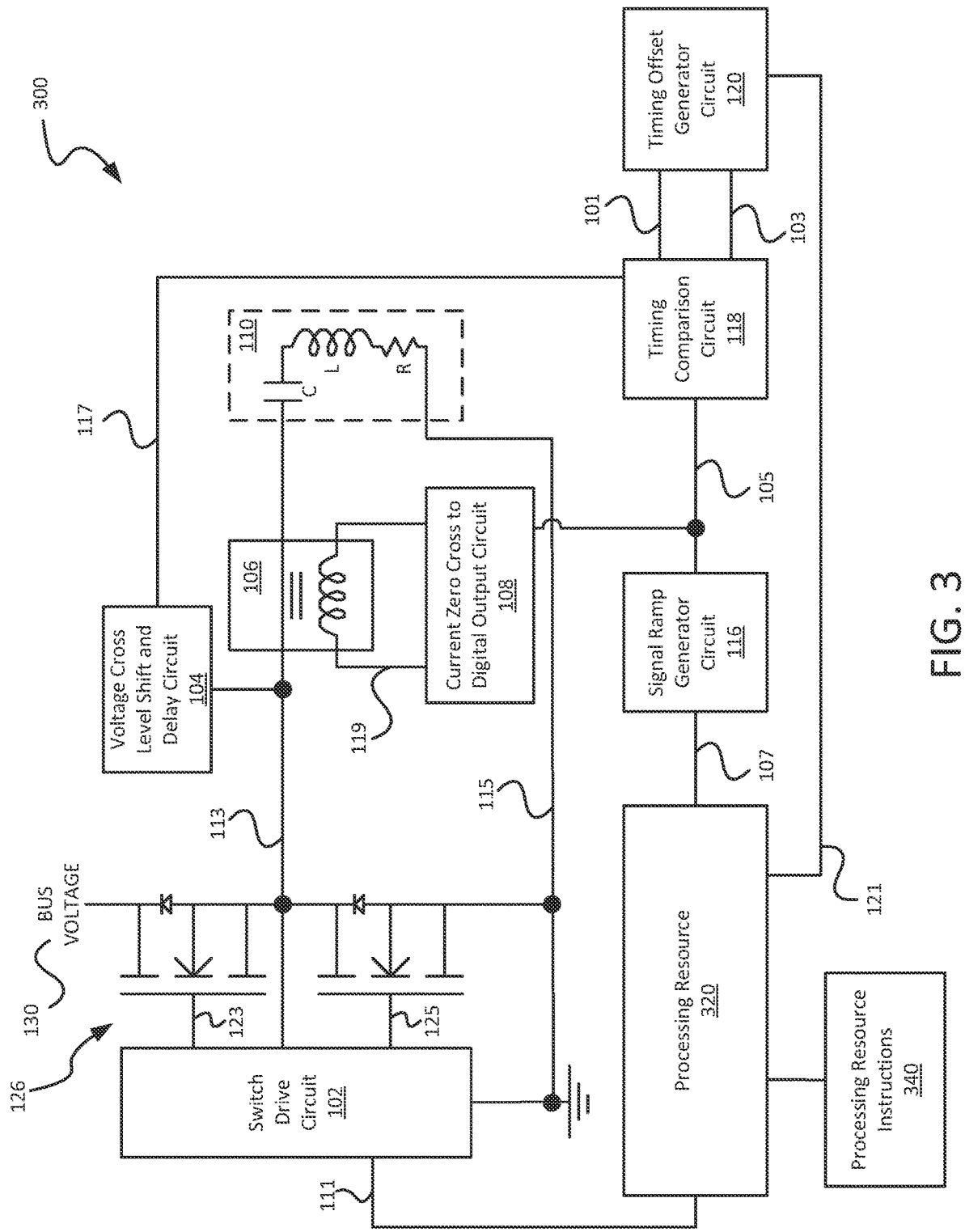
FIG. 3 is a block diagram of another power switching circuit in accordance with various embodiments.

FIG. 3 shows a block diagram of another power switching circuit 300 in accordance with various embodiments. Power switching circuit 300 includes many of the same elements as power switching circuit 100 described above in relation to FIG. 1, except that switch detect and dead band pulse generator circuit 112 and signal ramp comparator circuit 114 are replaced by a processing resource 320 that executes processing resource instructions from a storage medium 340 connected to processing resource 320. Executing the processing resource instructions causes processing resource 320 to provide gate drive signal 111 based upon ramp signal 107 and delay reference signal 121 similar to that discussed above in relation to FIGS. 1-2. Based upon the disclosure provided herein, one of ordinary skill in the art will recognize a variety of other functions of circuit elements of power switching circuit 100 that may be implemented by processing resource, and thus eliminated from the circuit.

Figure 5:
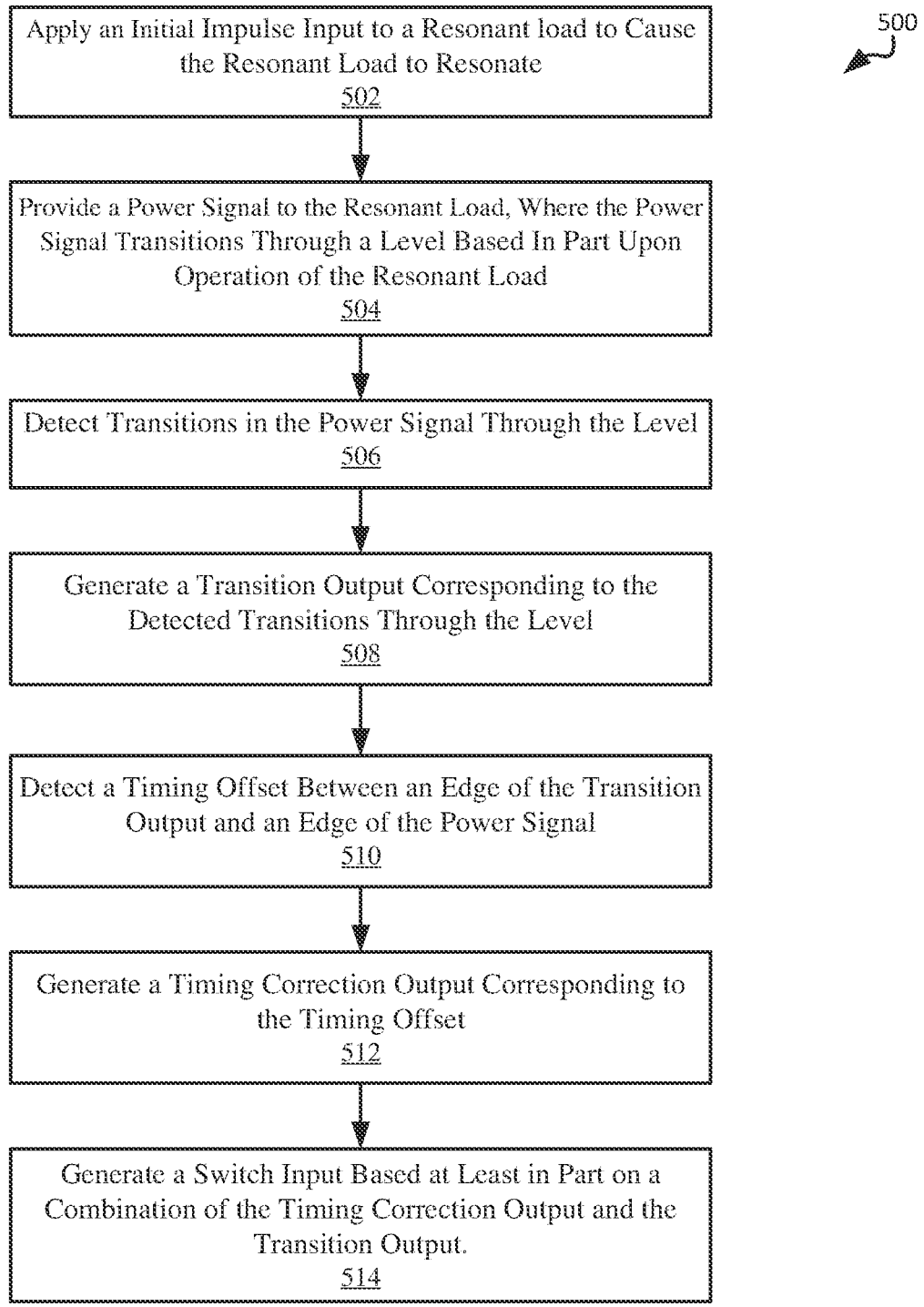
FIG. 5 is a flow diagram showing a method in accordance with some embodiments for providing power to a resonant load.

Turning to FIG. 5, a flow diagram 500 shows a method in accordance with some embodiments for providing power to a resonant load. Following flow diagram 500, an initial impulse input is applied to the resonant load to cause the resonant load to resonate (block 502). In some embodiments, this initial resonation input that may be, for example, an initial switch transition at levels required by the load that can be repeated for load sensing. Based upon the disclosure provided herein, one of ordinary skill in the art will recognize a variety of initial resonation inputs that may be used in relation to particular resonant loads. A power signal is provided to the resonant load (block 504). The power signal transitions through a level based in pail upon operation of the resonant load. Transitions of the power signal through the level are detected (block 506). A transition output is generated that corresponds to the detected transitions through the level (block 508). A timing offset it detected between an edge the transition output and an edge of the power signal (block 510), and a generating a timing correction output is generated that corresponds to the timing offset (block 512). A switch input is generated based at least in part on a combination of the timing correction output and the transition output (block 514).

In conclusion, the present invention provides for novel systems, devices, and methods. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A processing system, the system comprising:
   a load;
   a power switching circuit configured to provide a power signal to the load, wherein the power signal transitions through a level based in part upon operation of the load, and wherein the power switching circuit includes:
      a transition detection circuit configured to detect the transitions of the power signal through the level and to provide a corresponding transition output;
      a timing detection circuit configured to detect a time offset between an edge of the transition output and an edge of the power signal and provide a corresponding taming correction output;
      a signal generation circuit configured to generate a switch input based at least in part on a combination of the timing correction output and the transition output; and
      a switching drive circuit configured to change polarity of the power signal based at least in part on the switch input.

2. The system of claim 1, wherein a frequency of the load varies by more than ten percent.

3. The system of claim 1, wherein the transition detection circuit includes a transformer configured to transform the power signal to a transformed power signal.

4. The system of claim 3, wherein the transition detection circuit further includes:
   a level crossing detection circuit configured to detect a crossing of the transformed power signal through the level, and wherein the transition output is a timing signal indicating each occurrence of the crossing of the power signal through the level.

5. The system of claim 4, wherein a first time period between assertion of a first instance of the transition output and a second instance of the transition output can vary by more than five percent when compared to a second time period between assertion of the second instance of the transition output and a third instance of the transition output, wherein the second instance of the transition output directly follows the first instance of the transition output and the third instance of the transition output directly follows the second instance of the transition output.

6. The system of claim 4, wherein the level is a zero level, and wherein the level crossing detection circuit is a diode rectifier circuit configured to detect zero voltage crossings.

7. The system of claim 1, wherein the timing correction output is a voltage level, and wherein the signal generation circuit includes:
   a signal ramp generator circuit configured to generate a ramp signal that ramps from a defined level at a constant rate upon assertion of the transition output; and
   a signal ramp comparator circuit configured to assert a switch timing output each time the ramp signal is at least the voltage of voltage level of the timing correction output; and
   a pulse circuit configured to assert the switch input based at least in part on assertion of the switch timing output.

8. The system of claim 1, wherein the switching drive circuit includes:
   a switch circuit configured to switch between a first driver output and a second driver output based upon the switch input; and
   a half bridge inverter circuit controlling the power signal based upon the first driver output and the second driver output.

9. The system of claim 1, wherein the timing detection circuit includes:
   a voltage comparator circuit configured to assert a power signal timing output each time a voltage of the power signal crosses zero volts; and
   an edge comparator circuit configured to assert the timing correction output at a voltage level corresponding to a difference in an edge of the power signal and the edge of the transition output.

10. The system of claim 9, wherein the voltage level is:
    decreased when the edge of the transition output leads the edge of the power signal, and
    increased when the edge of the transition output lags the edge of the power signal.

11. A power switching circuit, the circuit comprising:
    a transition detection circuit configured to detect transitions of a power signal through a level and to provide a corresponding transition output;
    a timing detection circuit configured to detect a time offset between an edge of the transition output and an edge of the power signal and provide a corresponding timing correction output;
    a signal generation circuit configured to generate a switch input based at least in part on a combination of the timing correction output and the transition output; and
    a switching drive circuit configured to change polarity of the power signal based at least in part on the switch input.

12. The circuit of claim 11, wherein a frequency of the load varies by more than ten percent.

13. The circuit of claim 11, wherein the transition detection circuit includes:
    a level crossing detection circuit configured to detect a crossing of the power signal through the level, and wherein the transition output is a timing signal indicating each occurrence of the crossing of the power signal through the level.

14. The circuit of claim 13, wherein a frequency of recurrence of the timing signal is approximately a frequency of the load.

15. The circuit of claim 13, wherein the level is a zero level, and wherein the level crossing detection circuit is a diode rectifier circuit configured to detect zero voltage crossings.

16. The circuit of claim 11, wherein the timing correction output is a voltage level, and wherein the signal generation circuit includes:
    a signal ramp generator circuit configured to generate a ramp signal that ramps from a defined level at a constant rate upon assertion of the transition output; and a signal ramp comparator circuit configured to assert a switch timing output each time the ramp signal is at least the voltage of voltage level of the timing correction output; and a pulse circuit configured to assert the switch input based at least in part on assertion of the switch timing output.

17. The circuit of claim 11, wherein the switching drive circuit includes:

a switch circuit configured to switch between a first driver output and a second driver output based upon the switch input; and a half bridge inverter circuit controlling the power signal based upon the first driver output and the second driver output.

18. The circuit of claim 11, wherein the timing detection circuit includes:

a voltage comparator circuit configured to assert a power signal timing output each time a voltage of the power signal crosses zero volts; and an edge comparator circuit configured to assert the timing correction output at a voltage level corresponding to a difference in an edge of the power signal and the edge of the transition output.

19. The circuit of claim 18, wherein the voltage level is:

decreased when the edge of the transition output leads the edge of the power signal, and increased when the edge of the transition output lags the edge of the power signal.

20. A method for providing power to a resonant load, the method comprising:

applying an initial impulse input to the resonant load to cause the resonant load to resonate;

providing a power signal to the resonant load, wherein the power signal transitions through a level based in part upon operation of the resonant load;

detecting transitions in the power signal through the level;

generating a transition output corresponding to the detected transitions through the level;

detecting a timing offset between an edge the transition output and an edge of the power signal;

generating a timing correction output corresponding to the timing offset; and generating a switch input based at least in part on a combination of the timing correction output and the transition output.

\* \* \* \* \*